United States Patent
Olesen et al.

(10) Patent No.: US 11,134,587 B2
(45) Date of Patent: Sep. 28, 2021

(54) POWER MODULE WITH INTEGRATED COOLING DEVICE

(71) Applicant: Danfoss Silicon Power GmbH, Flensburg (DE)

(72) Inventors: Klaus Olesen, Nordborg (DK); Lars Paulsen, Nordborg (DK)

(73) Assignee: Danfoss Silicon Power GmbH, Flensburg (DE)

( * ) Notice: Subject to any disclaimer, the term of this patent is extended or adjusted under 35 U.S.C. 154(b) by 0 days.

(21) Appl. No.: 16/642,481

(22) PCT Filed: Sep. 25, 2018

(86) PCT No.: PCT/EP2018/075878
§ 371 (c)(1),
(2) Date: Feb. 27, 2020

(87) PCT Pub. No.: WO2019/068502
PCT Pub. Date: Apr. 11, 2019

(65) Prior Publication Data
US 2020/0187385 A1      Jun. 11, 2020

(30) Foreign Application Priority Data

Oct. 2, 2017  (DE) .......................... 102017217537.0

(51) Int. Cl.
*H05K 7/20*       (2006.01)
*H01L 23/473*   (2006.01)
*H01L 23/373*   (2006.01)

(52) U.S. Cl.
CPC ..... *H05K 7/20254* (2013.01); *H01L 23/3736* (2013.01); *H01L 23/473* (2013.01);
(Continued)

(58) Field of Classification Search
CPC .............. H01L 23/473; H05K 7/20218; H05K 7/20254; H05K 7/20927; H05K 7/20509
See application file for complete search history.

(56) References Cited

U.S. PATENT DOCUMENTS 4,559,580 A * 12/1985  Lutfy .................... H01L 23/473
                                                                  165/104.33
5,272,375 A    12/1993  Belopolsky
(Continued)

FOREIGN PATENT DOCUMENTS

| CN | 1653612 A | 8/2005 |
|----|-----------|--------|
| CN | 1892164 A | 1/2007 |

(Continued)

OTHER PUBLICATIONS

International Search Report for Serial No. PCT/EP2018/075878 dated Dec. 12, 2018.

*Primary Examiner* — Zachary Pape
(74) *Attorney, Agent, or Firm* — McCormick, Paulding & Huber PLLC

(57) ABSTRACT

An electric device, comprising: a power module having a circuit carrier on which a circuit component is disposed; a cooling structure; and an intermediate structure disposed between the circuit carrier and the cooling structure, wherein the cooling structure is made of a first metal material, and the intermediate structure is made of a second metal material having a higher thermal conductivity than that of the first metal material.

16 Claims, 7 Drawing Sheets

(52) U.S. Cl.
CPC ..... *H05K 7/20263* (2013.01); *H05K 7/20509* (2013.01); *H05K 7/20927* (2013.01)

(56) References Cited

U.S. PATENT DOCUMENTS

| | | | |
|---|---|---|---|
| 6,563,709 B2 | 5/2003 | Negishi et al. | |
| 6,986,382 B2 | 1/2006 | Upadhya et al. | |
| 8,199,505 B2 | 6/2012 | Dede | |
| 8,243,451 B2 | 8/2012 | Dede | |
| 8,963,321 B2 * | 2/2015 | Lenniger | H01L 23/367 257/712 |
| 9,423,192 B2 * | 8/2016 | Tsoi | F28F 3/048 |
| 9,888,617 B2 * | 2/2018 | Ishiyama | H01L 23/4012 |
| 2006/0086118 A1 | 4/2006 | Venkatasubramanian et al. | |
| 2006/0264073 A1 | 11/2006 | Yang et al. | |
| 2009/0065178 A1 | 3/2009 | Kasezawa et al. | |
| 2011/0067841 A1 | 3/2011 | Doo et al. | |
| 2011/0304985 A1 | 12/2011 | Rittner et al. | |
| 2013/0062750 A1 | 3/2013 | Lenniger et al. | |
| 2014/0069615 A1 | 3/2014 | Kusaka | |
| 2015/0041188 A1 | 2/2015 | Terasaki et al. | |
| 2015/0091151 A1 | 4/2015 | Kulas | |
| 2016/0109190 A1 | 4/2016 | Olesen et al. | |
| 2016/0219693 A1 | 7/2016 | Nishimoto et al. | |

FOREIGN PATENT DOCUMENTS

| | | |
|---|---|---|
| CN | 101167184 A | 4/2008 |
| CN | 202454546 U | 9/2012 |
| CN | 104517917 A | 4/2015 |
| GB | 2536051 A | 9/2016 |
| JP | 2007294983 A | 11/2007 |
| JP | 2008-294196 A | 12/2008 |
| JP | 2013-239666 A | 11/2013 |
| TW | 265430 B | 12/1995 |
| WO | 03095922 A2 | 11/2003 |

* cited by examiner

POWER MODULE WITH INTEGRATED COOLING DEVICE

CROSS-REFERENCE TO RELATED APPLICATIONS

This application is a National Stage application of International patent Application No. PCT/EP2018/075878, filed Sep. 25, 2018, which claims priority to German Application No. 102017217537.0, filed Oct. 2, 2017, each of which is hereby incorporated by reference in its entirety.

TECHNICAL FIELD

The present invention relates to the field of power electronics industry, and especially, to an electronic power module with integrated cooling device.

BACKGROUND

A power module with high power dissipation is often liquid cooled. A most common way of realizing liquid cooling is to assemble the power module onto a cold plate, for example, a metal plate with integrated tubing(s) for fluid flow. A thermal interface material (TIM) is needed to be provided between the power module and the cold plate.

A drawback with this indirect liquid cooling approach is the relative high thermal resistance in the TIM. To overcome this drawback and to improve thermal performance, the TIM needs to be eliminated.

A solution is to have coolant in direct liquid contact with the surface to be cooled. The most common approach to direct liquid cooling is to introduce cooling fins or pin fins on the surface to be cooled for enhancing the area in contact with the fluid. However, current direct liquid cooling approaches suffer from other drawbacks, such as: (1) the optimum thermal solution requires a channel width smaller than what is possible with the commonly applied forging processes; (2) tolerances of the bypass between pin fin and bathtub gives variations in cooling performance; and (3) deformation of the cold plate under a high absolute liquid pressure due to relative larger channel width.

There is needed a technical solution to attach the cold plate to the power module without using the TIM and meanwhile improving thermal conductivity and uniformity of thermal transmission. Further, there is also needed a technical solution to provide narrower fluid flow channels to achieve optimum cooling effect.

SUMMARY

The present invention has been made to overcome or alleviate at least one aspect of the above mentioned disadvantages.

Accordingly, it is an object of the present invention to provide a power module having integrated cooling structure.

In an aspect of the disclosure, there is provided an electric device, comprising: a power module having a circuit carrier on which a circuit component is disposed; a cooling structure; and an intermediate structure disposed between the circuit carrier and the cooling structure, wherein the cooling structure is made of a first metal material, and the intermediate structure is made of a second metal material having a higher thermal conductivity than that of the first metal material.

In one embodiment, the cooling structure is connected directly to the intermediate structure. This configuration is a great advantage in the conveyance of heat from the intermediate structure to the cooling structure without the heat having to pass through one or more additional layers, which would inevitably increase the thermal resistance of the conduction path and thus hinder efficient cooling of the components within the electric device.

In one embodiment, the intermediate structure is directly connected to the circuit carrier. This configuration is a great advantage in the conveyance of heat from the circuit carrier to the intermediate structure without the heat having to pass through one or more additional layers, which would inevitably increase the thermal resistance of the conduction path and thus hinder efficient cooling of the components mounted on the circuit carrier.

In one embodiment, the second metal material has a coefficient of thermal expansion lower than that of the first metal material.

In one embodiment, the cooling structure is made of aluminum, and wherein the intermediate structure comprises a copper-based structure.

In one embodiment, the copper-based structure comprises a copper plate.

In one embodiment, a thickness of the copper-based substrate is in a range from 25 μm to 5 mm.

In one embodiment, the intermediate structure is welded to the cooling structure.

In one embodiment, the intermediate structure is bonded to the bottom surface of the circuit carrier through soldering or low pressure silver sintering.

In one embodiment, the circuit carrier comprises any one of substrate, a direct copper bonded plate and a printed circuit board.

In one embodiment, the cooling structure comprises: a housing having a cavity; a flow distributer disposed within the cavity of the housing; and a cover plate configured to seal the cavity of the housing and attached to the intermediate structure.

In one embodiment, the cooling structure comprises: a main body formed with a fluid flow channel in a top surface thereof; and a cover plate covering the top surface of the main body to seal the fluid flow channel and attached to the intermediate structure.

In one embodiment, the cooling structure comprises: a main body formed with a fluid flow channel in a bottom surface thereof, a top surface of the main body being attach to the intermediate structure; and a cover plate covering the bottom surface of the main body to seal the fluid flow channel.

In one embodiment, the cooling structure comprises: a first plate-shaped body; and a second plate-shaped body disposed opposite to the first plate-shaped body, wherein the first plate-shaped body is formed on a surface thereof facing the second plate-shaped body with a first protruding structure, the second plate-shaped body is formed on a surface thereof facing the first plate-shaped body with a second protruding structure, and the first and second protruding structures form a fluid flow channel.

In one embodiment, a top end of the first protruding structure is bonded to the second plate-shaped body in a fluid-tight manner by welding or brazing, and a top end of the second protruding structure is bonded to the first plate-shaped body in a fluid-tight manner by welding or brazing.

In one embodiment, the welding or brazing comprises active metal brazing.

In one embodiment, the first protruding structure comprises a first wall extending in a first direction and a plurality of second walls extending towards the second protruding structure, the second protruding structure comprises a first wall extending in the first direction and a plurality of second walls extending towards the first protruding structure, and the second walls of the first protruding structure and the second walls of the second protruding structure are alternately arranged in the first direction, such that the fluid flow channel is tortuous.

In one embodiment, the second walls of the first protruding structure are equidistantly spaced apart by a distance of about 5.2 mm, the second walls of the second protruding structure are equidistantly spaced apart by a distance of about 5.2 mm, a thickness of each of the second walls of the first and the second protruding structures is about 1.2 mm.

In a second aspect of the disclosure, there is provided a method of manufacturing an electric device, comprising the steps of:
  supplying a first plate-shaped body,
  forming a first protruding structure on a surface of the first plate-shaped body,
  supplying a second plate-shaped body,
  forming a second protruding structure on a surface of the second plate-shaped body,
  bonding the top end of the first protruding structure to the second plate-shaped body in a fluid-tight manner by welding or brazing,
  bonding the top end of the second protruding structure to the first plate-shaped body in a fluid-tight manner by welding or brazing,
  whereby the first and second protruding structures form a fluid flow channel.

In one embodiment of the method the welding or brazing comprises active metal brazing.

In one embodiment of the method there is included the additional step of supplying one or more preforms to enable the welding or brazing process.

In one embodiment of the method at least one of the first protruding structures or the second protruding structures are formed by forging.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
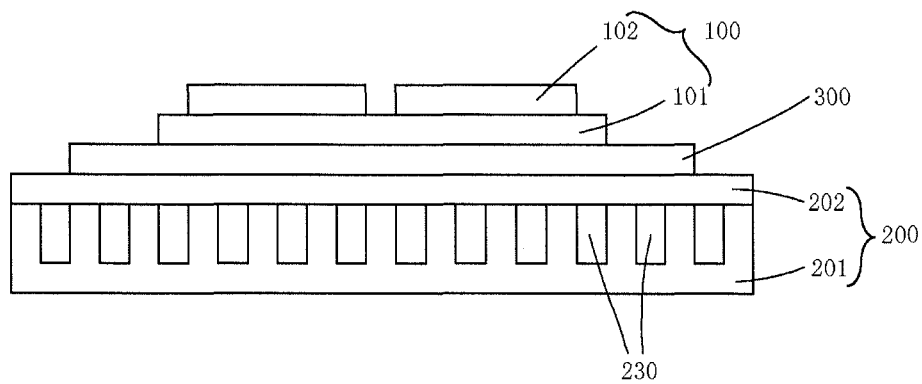
FIG. 1 is an illustrative view showing an electric device according to an embodiment of the disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In one aspect of the present disclosure, there is provided an electric device.

FIG. 1 shows an electric device according to an embodiment of the disclosure. The electric device comprises: a power module 100 having a circuit carrier 101 on which a circuit component 102 is disposed; a cooling structure 200; and an intermediate structure 300 disposed between the circuit carrier 101 and the cooling structure 200. The intermediate structure 300 is attached or bonded to a bottom surface of the circuit carrier 101 by welding or brazing. Other connection technologies such as brazing, soldering or sintering may also be utilized. The cooling structure 200 is made of a first metal material, and the intermediate structure 300 is made of a second metal material having a higher thermal conductivity than that of the first metal material.

An ordinary skilled in the art will understand that the power module 100 could be a power module of any type, the circuit carrier 101 may be, for example, a substrate, a direct copper bonded (DCB) plate, a printed circuit board (PCB) or the like, and the circuit component 102 could be any electric or electronic component, such as a chip, an integrated circuit, a microprocessor, semiconductor components and/or wires, and the number of the circuit component 102 could be one or more than one. In a typical power module, switching semiconductors such as IGBTs MOSFETs or other active components, may be used as the components 102, together with auxiliary components (such as diodes, resistors etc.) to enable the efficient operation of the semiconductors.

With the intermediate structure being made of a material having a higher thermal conductivity, as compared with a TIM, heat dissipated from the power module (i.e., the circuit carrier 100) can be more rapidly transmitted and spread in the intermediate structure, and more uniformly to the cooling structure. Meanwhile, welding or brazing may provide a better contact and bonding between the intermediate structure 300 and the circuit carrier 101.

In an embodiment, if the circuit carrier 101 is a ceramic substrate, a metal material having a low coefficient of thermal expansion (CTE) would be selected as the second metal material, and more preferably, the coefficient of thermal expansion of the second metal material is lower than that of the first metal material, such that a CTE mismatch between the ceramic substrate and cooling structure can be reduced.

Usually, the cooling structure 200 is made of aluminum, thus, the intermediate structure 300 may be a copper-based structure, because copper has a higher thermal conductivity and a lower coefficient of thermal expansion than aluminum. In a preferable embodiment, the intermediate structure 300 (or the copper-based structure) may be a copper plate. The copper plate may be bonded onto the aluminum-based cooling structure through forging, welding or brazing, soldering, low pressure silver sintering or the like. Other means of forming the copper plate may be used. For example the copper plate may be cold-gas sprayed, chemical- or electroplated onto the aluminium-based cooling structure.

The copper plate needs to have a suitable thickness such that heat may be spread more uniformly through the copper plate and transmitted to the cooling structure 200. Preferably, the thickness of the copper plate is from 25 µm to 5 mm. It is proposed that the copper plate has a relative larger thickness, which will be explained later.

In a preferable embodiment, the intermediate structure may be bonded to the cooling structure through welding or brazing. Of course, other metal joining processes could be used, depending on specific materials used for the intermediate structure and the cooling structure.

In an embodiment, the intermediate structure is bonded to the bottom surface of the circuit carrier through soldering or low pressure silver sintering. Compared with welding or brazing or other joining methods, soldering and low pressure sintering processes have little influence on the structure of the power module or the circuit carrier. It is understood by an ordinary skilled in the art that the "low pressure" may vary, depending on the materials, and typically, the low pressure is about 5 MPa.

As shown in FIGS. 1-5, the cooling structure may have different configurations.

In the embodiment shown in FIG. 1, the cooling structure 200 includes: a main body 201 formed with fluid flow channels 230 in a top surface thereof; and a cover plate 202 covering the top surface of the main body 201 to form closed fluid flow channels. The cover plate 202 is attached to the intermediate structure 300.

Figure 2:
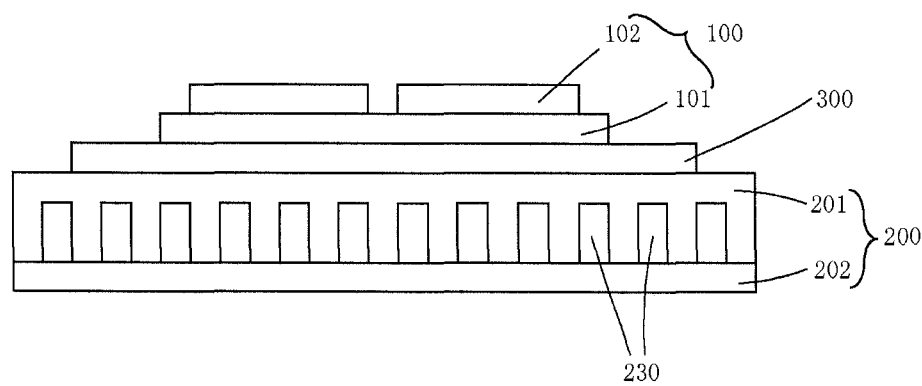
FIG. 2 is an illustrative view showing an electric device according to another embodiment of the disclosure.

In the embodiment shown in FIG. 2, the cooling structure 200 includes: a main body 201 formed with fluid flow channels 230 in a bottom surface thereof; and a cover plate 202 covering the bottom surface of the main body 201 to form closed fluid flow channels. The main body 201 is attached to the intermediate structure 300.

Figure 3:
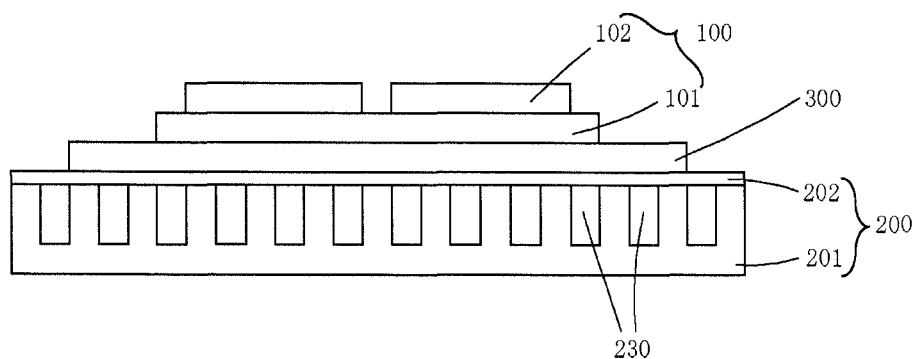
FIG. 3 is an illustrative view showing an electric device according to a further embodiment of the disclosure.

The embodiment shown in FIG. 3 is similar to the embodiment shown in FIG. 1, and the only difference therebetween lies in that the thickness of the cover plate 202 shown in FIG. 3 is much smaller than the thickness of the cover plate 202 shown in FIG. 1. A reason for this difference is that, if the intermediate structure 300 is solidly bonded to the cover plate 202 of the cooling structure 200 by, for example, welding or brazing, forging or the like, the intermediate structure 300 and the cover plate 202 act as one integrated component that may provide a higher mechanical strength than the cover plate 202 of FIG. 1. Therefore, as compared with the cover plate shown in FIG. 1, the cover plate 202 of FIG. 3 can be made much thinner. In this manner, cost will be reduced, and heat from the power module 100 can be much quickly transmitted to the cooling fluid flowing through the fluid flow channels due to the reduction in thickness of the cover plate which has a lower thermal conductivity.

Figure 4:
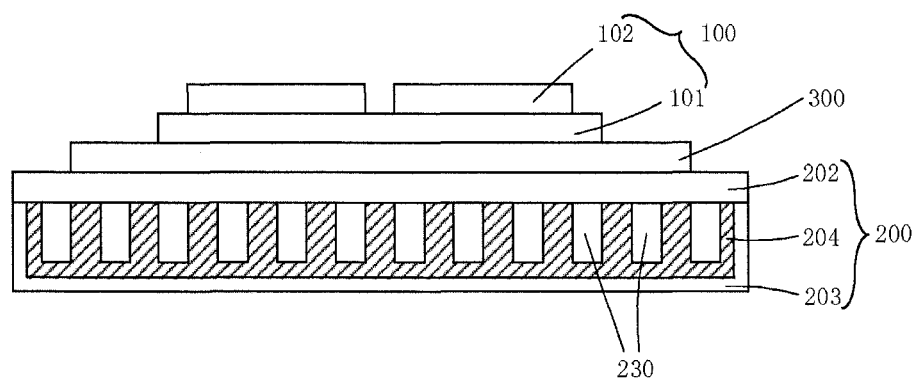
FIG. 4 is an illustrative view showing an electric device according to a still further embodiment of the disclosure.

In the embodiment shown in FIG. 4, the cooling structure 200 includes: a housing 203 having a cavity; a flow distributer 204 disposed within the cavity of the housing 203; and a cover plate 202 configured to seal the cavity of the housing 203 and attached to the intermediate structure 300. The flow distributer 204 may be made of aluminum, copper or other metal materials having high thermal conductivity and compatible with metal joining processes, such as active metal brazing. The flow distributer 204 may be a one-piece component or several components that are stacked with each other or arranged side by side.

In another aspect of the disclosure, there is provided a new configuration of the cooling structure, such that narrower fluid flow channels, compared with conventional cooling structures, would be obtained. An exemplary embodiment of such cooling structure is shown in FIGS. 5-7.

Figure 5:
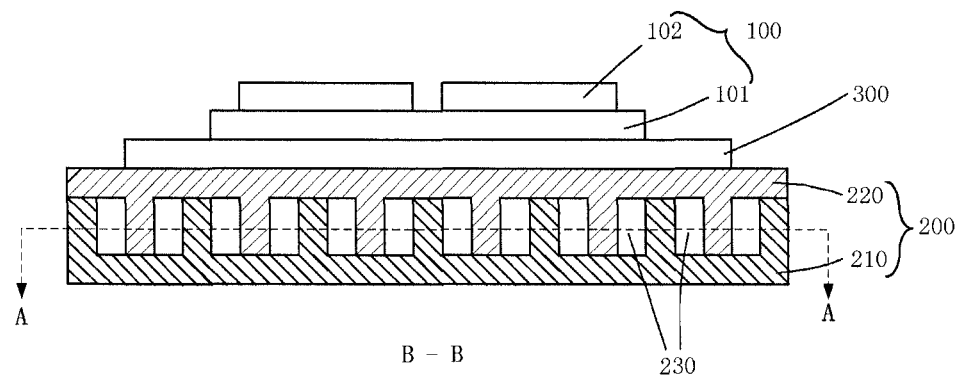
FIG. 5 is an illustrative view showing an electric device according to a still further embodiment of the disclosure.
Figure 6A:
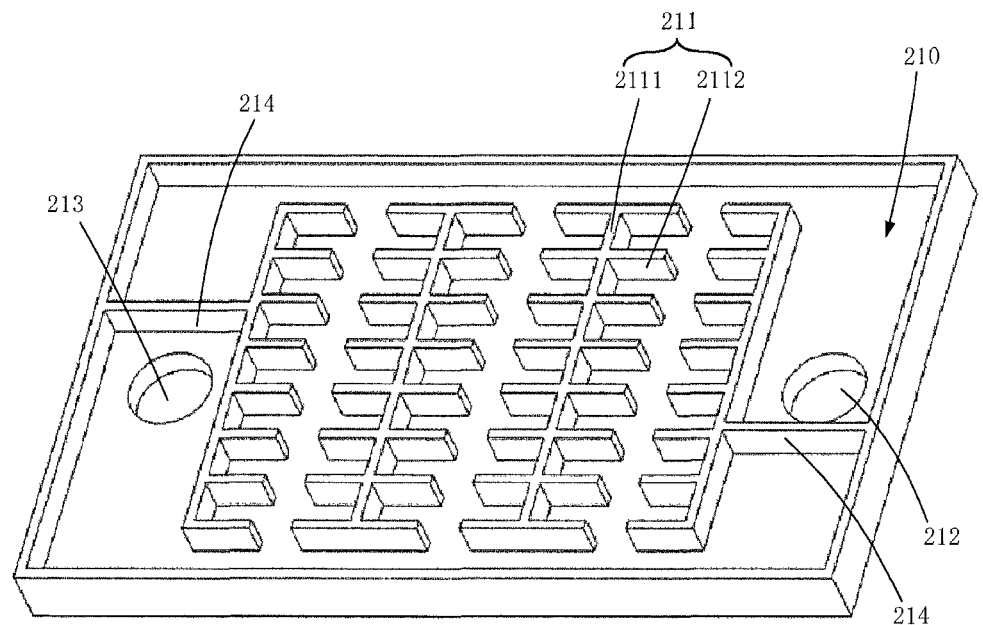
FIG. 6a is an illustrative perspective view showing a first body of the cooling structure shown in FIG. 5.
Figure 6B:
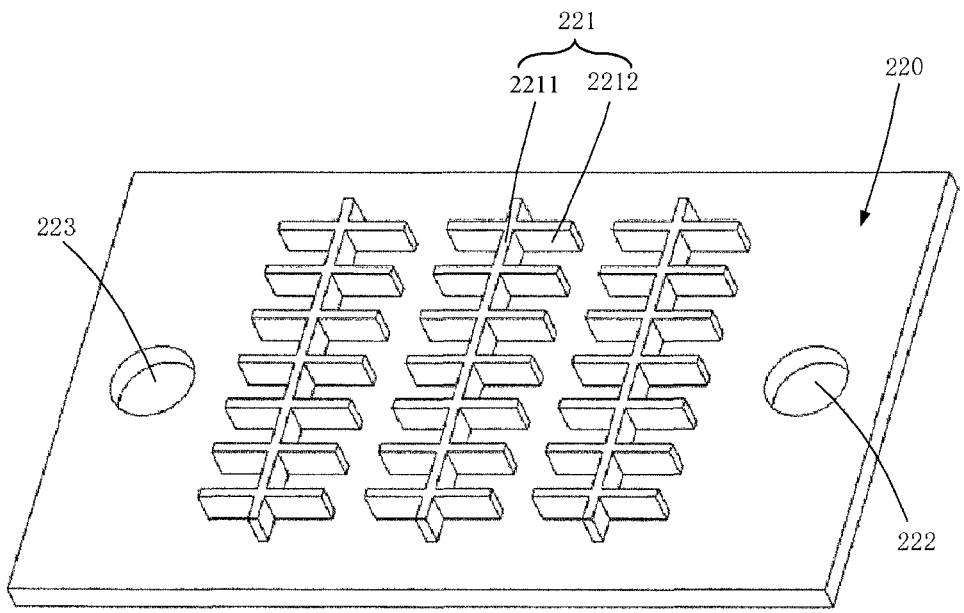
FIG. 6b is an illustrative perspective view showing a second body of the cooling structure shown in FIG. 5.
Figure 7:
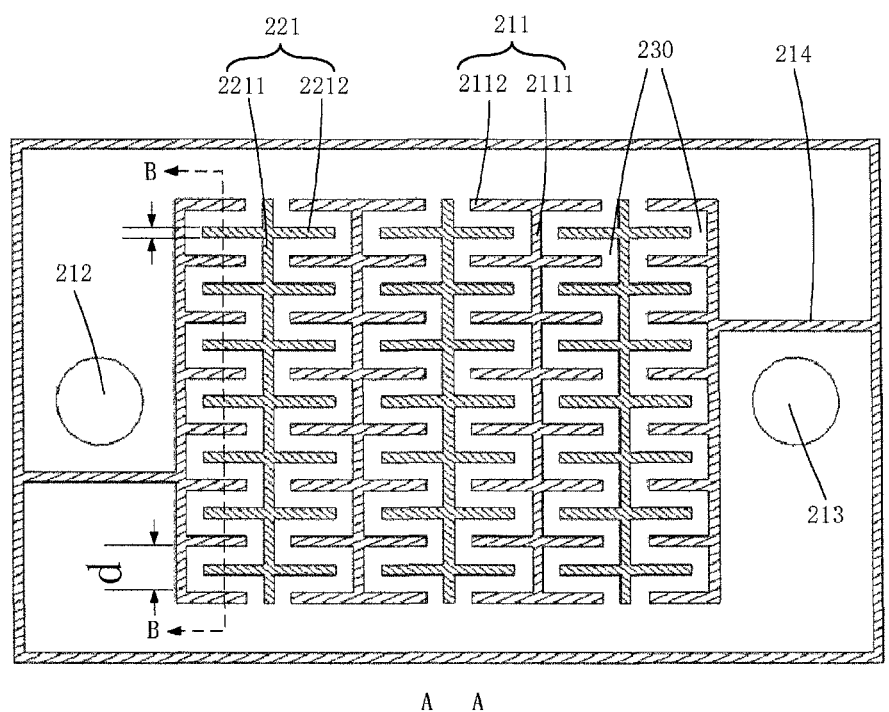
FIG. 7 is an illustrative cross sectional view taken along the line A-A of FIG. 5.

As shown in FIGS. 5 to 7, the cooling structure 200 includes: a first plate-shaped body 210; and a second plate-shaped body 220 disposed opposite to the first plate-shaped body 210. The first plate-shaped body 210 is formed on a surface thereof facing the second plate-shaped body 220 with a first protruding structure 211, and the second plate-shaped body 220 is formed on a surface thereof facing the first plate-shaped body 210 with a second protruding structure 221. As shown in FIG. 5, when the first plate-shaped body 210 and the second plate-shaped body 220 are assembled together, the first and second protruding structures cooperate with each other to form at least one fluid flow channel 230.

In the embodiment, in order to make sure that cooling fluid flows along a predetermined channel, a top end of the first protruding structure 211 should be pressed against the surface of the second plate-shaped body 220 facing the first plate-shaped body 210, and similarly, a top end of the second protruding structure 221 should be pressed against the surface of the first plate-shaped body 210 facing the first plate-shaped body 220, as shown in FIG. 5. Additionally, to provide a good fluid-tight sealing between the top ends of the protruding structures 210, 220 and the surfaces of the first and second plate-shaped bodies 210, 220, an active metal brazing (AMB) process may be performed at contact positions between the first plate-shaped body 210 and the second plate-shaped body 220. AMB is a known process in which a reaction is initiated between an active element such as titanium and carbides, oxides or nitrides present in the surfaces to be brazed. Other active elements such as vanadium, hafnium, zirconium or chromium may also be considered. AMB is often carried out in a vacuum furnace, where the surrounding atmosphere can be controlled.

As shown in FIG. 6a, the first protruding structure 211 includes a first wall 2111 extending in a first direction and a plurality of second walls 2112 extending in a second direction that is perpendicular to the first direction. It should be noted that, however, the orientations shown in FIG. 6a are exemplary, the first direction and the second direction need not to be perpendicular to each other, and for example, the second direction may be orientated at an angle of 60 to 120 degrees to the first direction. The angle may be determined based on desired flow characteristics.

As shown in FIG. 6b, the second protruding structure 221 includes a first wall 2211 extending in the first direction and a plurality of second walls 2212 extending in the second direction. It can be understood that, there may be one or more first walls 2111 on the first plate-shaped body 210 and one or more first walls 2211 on the second plate-shaped body 220.

As shown FIG. 7, which shows a cross section (i.e., the central part of FIG. 7) of the cooling structure 200 taken along line A-A of FIG. 5, the first walls 2111 of the first protruding structure 211 and the first walls 2211 of the second protruding structure 211 are formed alternately in a left-to-right direction. Moreover, the lower part of FIG. 5 is a cross section of the cooling structure 200 taken along the line B-B of FIG. 7, and it can be seen form FIGS. 5 and 7 that the second walls 2112 of the first protruding structure 211 and the second walls 2212 of the second protruding structure 211 are formed alternately in the first direction.

Each second wall 2112 of the first protruding structure 211 extends into a space between two adjacent second walls 2212 of the second protruding structure 221, and each second wall 2212 of the second protruding structure 221 extends into a space between two adjacent second walls 2112 of the first protruding structure 211. In such a manner, a tortuous fluid flow channel is formed between one first protruding structure 211 and an adjacent second protruding structure 221.

Conventionally, the fluid flow channel is formed into an aluminum-based plate through casting, forging, machining, 3D-printing or like processes. Thus, there is often a minimum limit for the width of the channel, depending on the process used to form the channel. Usually, a minimum width of the channel, for example, is about 3 mm. However, through experiments, the inventor found that an optimal cooling effecting would be achieved if the width of the channel is reduced to about 2 mm. Therefore, the embodiment shown in FIGS. 5-7 is provided to address this technical problem.

According to the embodiment of the present disclosure shown in FIGS. 5-7, each of the first plate-shaped body 210 and the second plate-shaped body 220 can be formed respectively. For example, a thickness t of each second wall 2212 of the second plate-shaped body 220 may be set to 1.2 mm, and a distance d between adjacent second walls 2112 of the first plate-shaped body 210 may be set to 5.2 mm, thus, a distance between a second wall 2212 and an adjacent second wall 2112 (i.e., the width of the channel) in the direct direction could be set to 2 mm. In such a manner, each of the first plate-shaped body 210 and the second plate-shaped body 220 could be manufactured through a conventional process, and the width of the channel could be reduced, such that optimal cooling effect of the cooling structure can be achieved.

It could also be understood by a person of ordinary skilled in the art that, a thickness of each second wall 2112 of the first plate-shaped body 210 may also be set to 1.2 mm, a distance between adjacent second walls 2212 of the second plate-shaped body 220 may also be set to 5.2 mm, and the second wall 2112 may be extended towards but spaced apart from the first wall 2211 by a distance of 2 mm, such that the width of the entire channel is constant.

As shown in FIGS. 6a, 6b and 7, the first plate-shaped body 210 has an inlet opening 212 and an outlet opening 213, and similarly, the second plate-shaped body 220 has an inlet opening 222 and an outlet opening 223. Cooling fluid may flow into the cooling structure 200 from the inlet openings 212, 222, flow through the channels 230, and flow out of the cooling structure 200 from the out openings 213, 223. There also may be partition walls 214 to isolate the inlet openings from the outlet openings. It can be understood that, the inlet openings and outlet openings may have various different forms, for example, they may be formed in a side wall of the cooling structure. Also, the partition walls 214 may be replaced by any structure that can isolate the openings and the outlet openings.

In a second aspect of the disclosure, there is provided a method of manufacturing an electric device.

Figure 8:
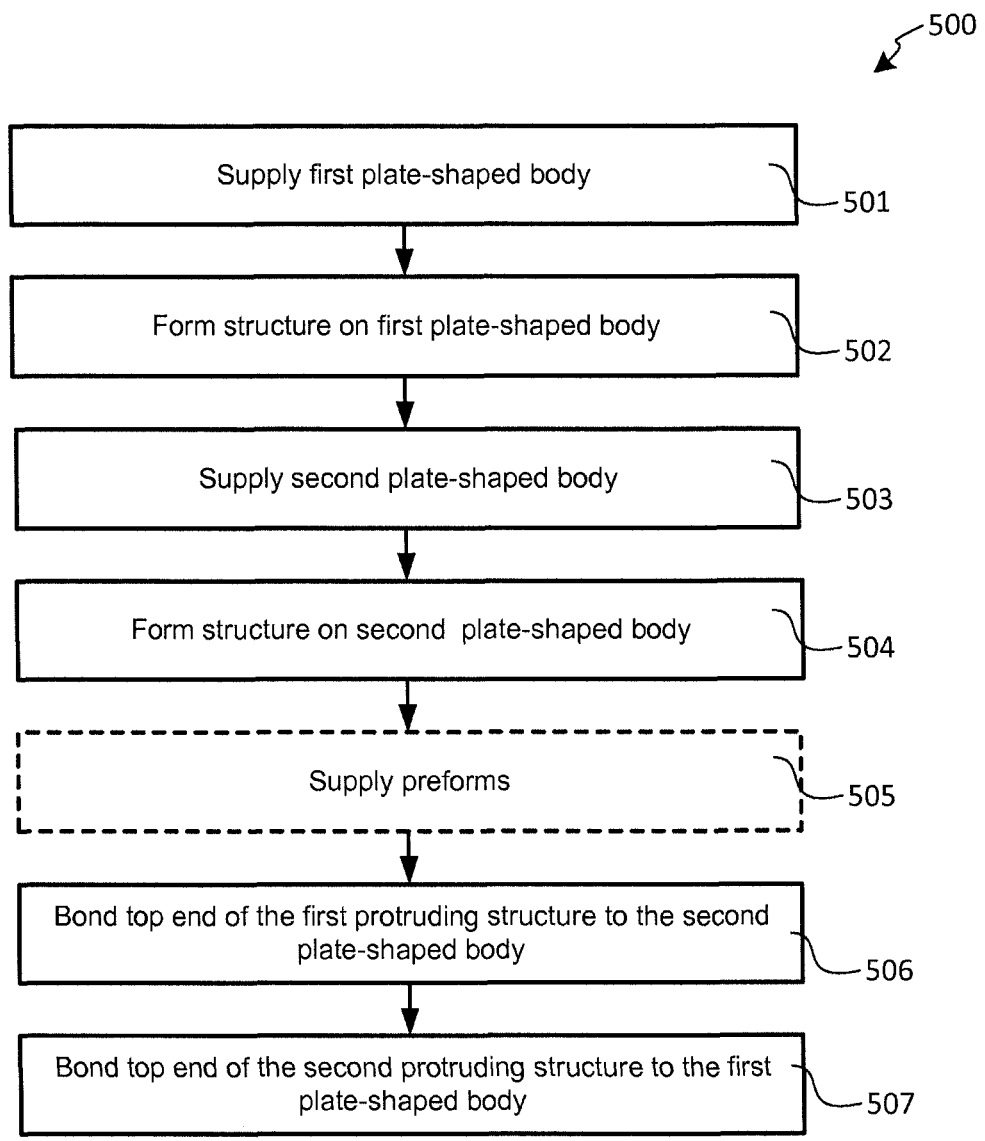
FIG. 8 is a diagram of an embodiment of the inventive method of manufacturing an electric device.
Figure 9A:
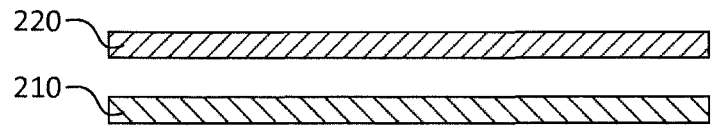
FIG. 9 illustrates the various steps comprising an embodiment of the inventive method.
Figure 9B:
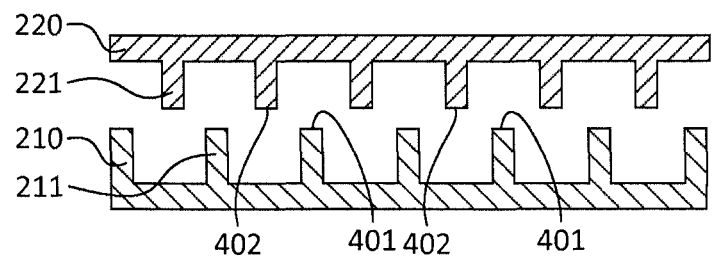
Figure 9C:
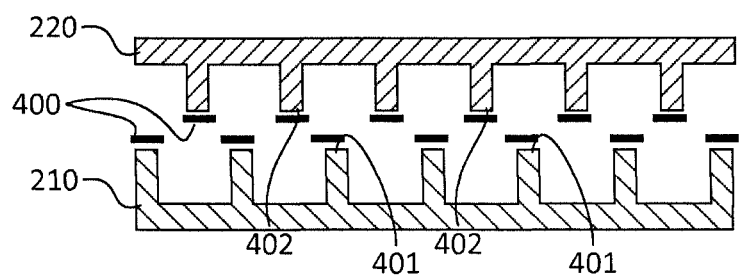
Figure 9D:
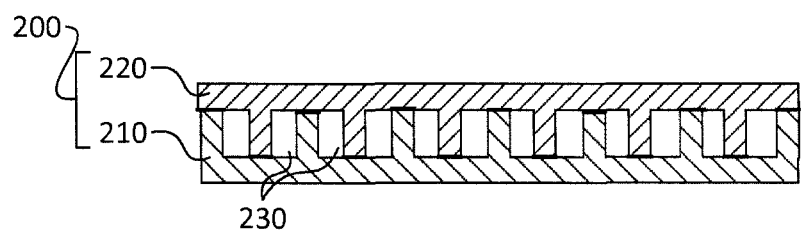

This method of manufacturing an electric device, is shown diagrammatically in FIG. 8. Here the method 500 comprises the steps of supplying 501 a first plate-shaped body 210, forming 502 a first protruding structure 211 on the first plate-shaped body 210, supplying 503 a second plate-shaped body 220 and forming 504 a second protruding structure 221 on the second plate-shaped body 220. The steps above may be followed by an optional step of supplying 505 one or more preforms 400 and placing them on the top ends 401, 402 of the first and second protruding structures 211, 221 that will be contacting the corresponding areas of the first and second plate-shaped bodies 210, 220. Two further steps in the method comprise bonding 506 the top end 401 of the first protruding structure 211 to the second plate-shaped body 220 in a fluid-tight manner by welding or brazing, and bonding 507 the top end 402 of the second protruding structure 221 to the first plate-shaped body 210 in a fluid-tight manner by welding or brazing. In this manner the first and second protruding structures 211, 221 form a fluid flow channel 230.

FIG. 9 illustrates the various steps comprising an embodiment of the inventive method. FIG. 9a shows a first plate-shaped body 210 and a second plate-shaped body 220. In FIG. 9b a first protruding structure 211 and a second protruding structure 221 are shown formed on the first plate-shaped body 210 and the second plate-shaped body 220 respectively. In FIG. 9c preforms 400 have been supplied and are placed at the top ends 401, 402 of the first and second protruding structures 211, 221 respectively. In FIG. 9d the 2 plate-shaped bodies 210, 220 and the corresponding protruding structures 211, 221 are joined by bonding the top ends 401 of the first protruding structure 211 to the second plate-shaped body 220 and bonding the top ends 402 of the second protruding structure 221 to the first plate-shaped body 210, thus forming a cooling structure 200 comprising fluid flow channels 230.

Figure 10A:
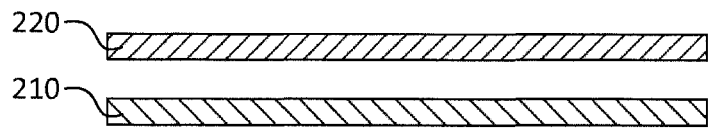
FIG. 10 illustrates the various steps comprising an alternative embodiment of the inventive method.
Figure 10B:
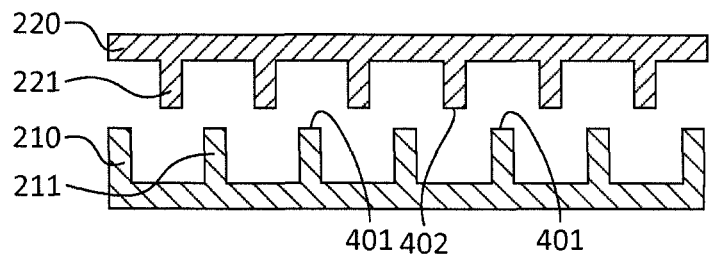
Figure 10C:
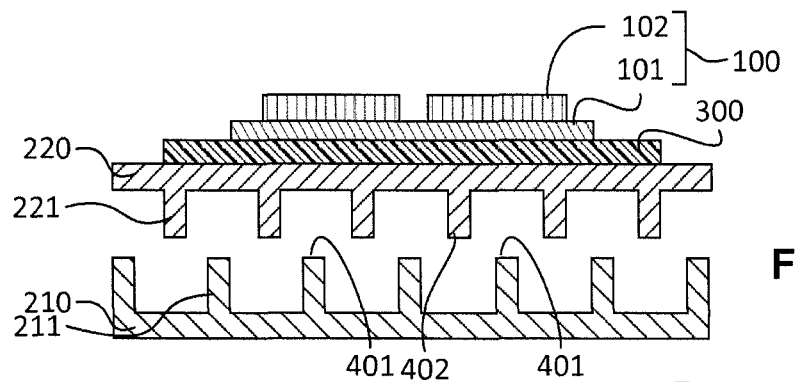
Figure 10D:
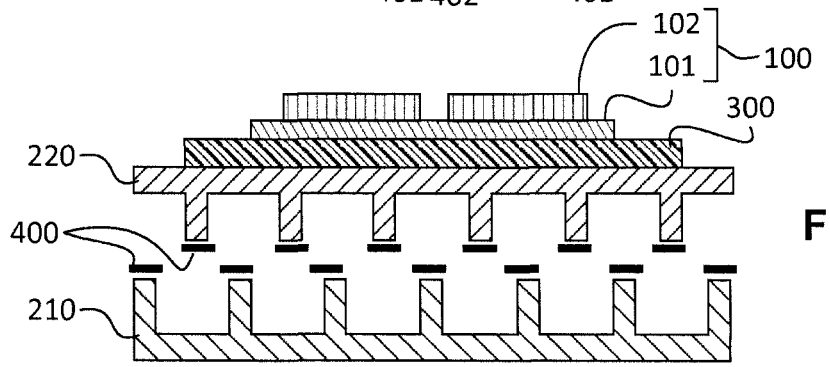
Figure 10E:
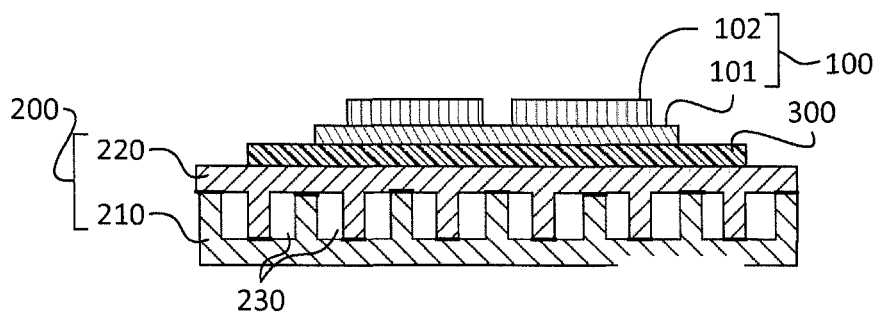

FIG. 10 illustrates a second embodiment of the inventive method, similar to that shown in FIG. 9 but with the additional step that in FIG. 10c a power module 100 comprising a circuit carrier 101, on which a circuit component 102 is disposed, and an intermediate structure 300 as described above, are attached to the second plate-shaped body 220. The intermediate structure 300 may be attached or bonded to a bottom surface of the circuit carrier 101 by welding or brazing, or by other known connection technologies such as sintering. Otherwise, the method illustrated in FIG. 10 is the same as that illustrated in FIG. 9.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An electric device, comprising:
    a power module having a circuit carrier on which a circuit component is disposed;
    a cooling structure; and
    an intermediate structure disposed between the circuit carrier and the cooling structure,
    wherein the cooling structure is made of a first metal material, and the intermediate structure is made of a second metal material having a higher thermal conductivity than that of the first metal material, and
    wherein the cooling structure comprises:
    a first plate-shaped body; and
    a second plate-shaped body disposed opposite to the first plate-shaped body,
    wherein the first plate-shaped body is formed on a surface thereof facing the second plate-shaped body with a first protruding structure, the second plate-shaped body is formed on a surface thereof facing the first plate-shaped body with a second protruding structure, and the first and second protruding structures form a fluid flow channel, and wherein the first protruding structure comprises a first wall extending in a first direction and a plurality of second walls extending towards the second protruding structure, the second protruding structure comprises a first wall extending in the first direction and a plurality of second walls extending towards the first protruding structure, and the second walls of the first protruding structure and the second walls of the second protruding structure are alternately arranged in the first direction, such that the fluid flow channel is tortuous.

2. The electric device according to claim 1, wherein the cooling structure is connected directly to the intermediate structure.

3. The electric device according claim 1, wherein the intermediate structure is directly connected to the circuit carrier.

4. The electric device according to claim 1, wherein the second metal material has a coefficient of thermal expansion lower than that of the first metal material.

5. The electric device according claim 1, wherein the cooling structure is made of aluminum, and wherein the intermediate structure comprises a copper-based structure.

6. The electric device according to claim 5, wherein the copper-based structure comprises a copper plate.

7. The electric device according to claim 5, wherein a thickness of the copper-based substrate is in a range from 25 μm to 5 mm.

8. The electric device according to claim 1, wherein the intermediate structure is bonded to the bottom surface of the circuit carrier through soldering or low pressure silver sintering.

9. The electric device according to claim 1, wherein the circuit carrier comprises any one of substrate, a direct copper bonded plate and a printed circuit board.

10. The electric device according to claim 1, wherein a top end of the first protruding structure is bonded to the second plate-shaped body in a fluid-tight manner by welding or brazing, and a top end of the second protruding structure is bonded to the first plate-shaped body in a fluid-tight manner by welding or brazing.

11. The electric device according to claim 10, wherein the welding or brazing comprises active metal brazing.

12. The electric device according to claim 1, wherein the second walls of the first protruding structure are equidistantly spaced apart by a distance of about 5.2 mm, the second walls of the second protruding structure are equidistantly spaced apart by a distance of about 5.2 mm, a thickness of each of the second walls of the first and the second protruding structures is about 1.2 mm.

13. A method of manufacturing the electric device, recited in claim 1, comprising the steps of:
    supplying the first plate-shaped body,
    forming the first protruding structure on a surface of the first plate-shaped body,
    supplying the second plate-shaped body,
    forming the second protruding structure on a surface of the second plate-shaped body,
    bonding the top end of the first protruding structure to the second plate-shaped body in a fluid-tight manner by welding or brazing, and
    bonding the top end of the second protruding structure to the first plate-shaped body in a fluid-tight manner by welding or brazing,
    whereby the first and second protruding structures form a fluid flow channel.

14. The method of manufacturing the electric device according to claim 13 whereby the welding or brazing comprises active metal brazing.

15. The method of manufacturing the electric device according to claim 14 comprising the additional step of supplying one or more preforms to enable the welding or brazing process.

16. The method of manufacturing the electric device according to claim 13 in which at least one of the first protruding structures or the second protruding structures are formed by forging.

* * * * *